United States Patent
Hsu et al.

(10) Patent No.: US 7,902,666 B1
(45) Date of Patent: Mar. 8, 2011

(54) FLIP CHIP DEVICE HAVING SOLDERED METAL POSTS BY SURFACE MOUNTING

(75) Inventors: Hung-Hsin Hsu, Hsinchu (TW); Jui-Ching Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 37 days.

(21) Appl. No.: 12/573,608

(22) Filed: Oct. 5, 2009

(51) Int. Cl.
*H01L 23/48* (2006.01)
(52) U.S. Cl. ..... 257/737; 257/738; 257/734; 257/E23.01
(58) Field of Classification Search ................. 257/734, 257/737, 797, 774, 778, 738, E23.01
See application file for complete search history.

(56) References Cited

U.S. PATENT DOCUMENTS 6,229,220 B1 5/2001 Saitoh et al.

Primary Examiner — Roy K Potter
(74) Attorney, Agent, or Firm — Muncy, Geissler, Olds & Lowe, PLLC

(57) ABSTRACT

A disclosed semiconductor device having MPS-C2 (Metal Post Solder-Chip Connection) structure can be mounted on a PCB by an SMT mounter. A chip is disposed on a substrate. The substrate has a plurality of connecting pads and a plurality of accessory pads, and the chip has a plurality of corresponding metal posts and a plurality of accessory bumps. The dimensions on the soldered flat tops of the accessory bumps are corresponding to the soldered areas of the accessory pads where each soldered flat top has a plurality of angular corners and an edge between two adjacent angular corners where the length of the edge is twice greater than the pad pitch. Therefore, the displaced or rotational displaced metal posts can be pulled back and self-aligned during reflow processes so that an SMT mounter with poor alignment accuracy can be implemented for flip-chip bonding the semiconductor device having MPS-C2 structure to replace the conventional expensive flip-chip die bonder and to achieve higher productivity. Furthermore, the shape of the flat top surfaces of the metal posts does not have to match with the shape of the connecting pads.

20 Claims, 15 Drawing Sheets

FLIP CHIP DEVICE HAVING SOLDERED METAL POSTS BY SURFACE MOUNTING

FIELD OF THE INVENTION

The present invention relates to a semiconductor device, and more particularly to a semiconductor flip-chip assembly having MPS-C2 (Metal Post Solder-Chip Connection) structure.

BACKGROUND OF THE INVENTION

The conventional flip-chip bonding technology is related to dispose a plurality of bumps such as solder balls on an active surface of a chip, then the bumps are electrically and mechanically jointed to the corresponding connection pads of a substrate or a printed circuit board by flipping, attaching, and reflow processes to complete a flip chip assembly. When comparing to the conventional electrical connections of wire bonding, flip chip technologies can be implemented in semiconductor packages with high pin counts to provide shorter electrical connections between bumped chips and substrates with good signal qualities at higher operation frequencies. Traditionally, the solder balls are electrically and mechanically connected to the substrate by reflow processes. However, the solder balls are completely melt under reflow temperature which can not maintain a specific gap between the bumped chip and the substrate, moreover, the solder balls after reflow are spherical with the contour extending outside the corresponding connection pads. To avoid electrical short between the adjacent solder bumps due to bridging and potential contamination issues, a redistribution layer (RDL) has to be designed on an active surface of a chip to change the positions of the solder balls and to increase pitches between solder balls.

Due to the above mentioned issues, IBM (International Business Machines Corporation) implemented metal posts to replace the conventional solder balls without RDL to make the pitch of the metal posts equal to the one of the bonding pads of a chip which is less than 80 μm where soldering materials are implemented for achieving electrical and mechanical connections between the metal posts of the chip and the connection pads of the substrate, i.e., MPS-C2 technology (Metal Post Solder-Chip Connection). During reflow processes, the reflow temperature does not reach the melting point of the metal posts to keep the pillar shape intact without melting into balls. Moreover, the bump pitch of the metal posts can be greatly reduced without bridging issues between the adjacent bumps as the conventional solder balls. Therefore, the bumps can be disposed in a much higher density with smaller pitches without RDL where specific joint heights can be maintained without affecting the filling of underfill materials. This MPS-C2 technology is disclosed in U.S. Pat. No. 6,229,220 B1, entitled "Bump structure, bump forming method and package connection body"

In the MPS-C2 technology, flip-chip die bonder is implemented for fabricating a semiconductor flip-chip assembly by soldering metal posts. As shown in FIG. 1, a substrate 110 has a plurality of bonding fingers 111 disposed on the substrate 110. As shown in FIG. 2, a chip 120 has a plurality of metal posts 121 corresponding to the bonding fingers 111 of the substrate 110 and a component active area 124 located on the center of the active surface of the chip 120 where the metal posts 121 are not disposed inside the component active area 124. Without RDL, the metal posts 121 can be disposed at peripheries of the active surface or any locations except the component active area 124. As shown in FIG. 3, the soldering materials 130 are disposed at the flat tops of the metal posts 121. Through reflow processes, the metal posts 121 are electrically and mechanically connected to the bonding fingers 111 of the substrate 110 by reflowing the soldering materials 130. During flip-chip assembly processes, the metal posts 121 of the chip 120 are aligned to the bonding fingers 111 where the high alignment accuracy is strictly required that the virtual central lines of the bonding fingers 111 can not exceed the edges of the metal posts 121. As shown in FIG. 3, the maximum displacement tolerance between the metal posts 121 and the bonding fingers 111, i.e., the alignment accuracy, can not be greater than half of the width of the bonding fingers 111 which is 25 μm. By using the surface tension of the melt soldering materials 130 under reflowing temperatures, the metal posts 121 still can accurately be aligned to the bonding fingers 111. Therefore, for chips with smaller bump pitches, such as 80 μm pitches or even smaller such as 50 μm pitches, the requirement of alignment accuracy will become higher and tighter. Therefore, in the conventional flip chip technologies, only flip-chip die bonders can achieve the fabrication of flip-chip assembly having MPS-C2 with satisfied yield.

As shown in FIG. 4A, the metal posts 121 are completely aligned to the bonding fingers 111 before reflow processes so that the chip 120 can accurately be connected to the substrate 110 after reflow processes without misalignment issues. As shown in FIG. 4B, with a certain displacement after alignment, the displacement tolerance δ of the chip 120 can not be greater than half of the width, W, of the bonding fingers 111, i.e., $\delta < \frac{1}{2} W$, so that the metal posts 121 still can be aligned to the virtual central line of the corresponding bonding fingers 111. During reflow processes, the melt soldering material 130 still has the self-alignment characteristic to pull back and align the displaced metal posts 121 to the corresponding bonding fingers 111 to overcome chip misalignment as shown in FIG. 4C.

However, as shown in FIG. 5, when the displacement tolerance δ of the chip 120 is greater than half of the width, W, of the bonding fingers 111, i.e., $\delta > \frac{1}{2} W$, any portions of the metal posts 121 can not be aligned to the virtual central line of the corresponding bonding fingers 111 leading to alignment failure. As shown in FIG. 5B, the soldering materials 130 of the metal posts 121 will be mainly located at the spacing between adjacent bonding fingers 111. Once the soldering materials 130 contact to two adjacent bonding fingers 111, the melt soldering material 130 during reflow processes will not be able to achieve self-alignment of a chip leading to bridging, i.e., electrical short. Or, as shown in FIG. 5C, even though the soldering materials 113 can slightly pull the metal posts 121 back to alignment during reflow processes, however, the metal posts 121 only partially contact to the correct pin positions of the corresponding bonding fingers 111 forming solder joints that can easily be broken. Therefore, when the displacement tolerance δ of the chip 120 is greater than half of the width, W, of the bonding fingers 111, quality of electrical connections as well as the yield of flip-chip assembly are greatly reduced.

As shown in FIG. 6A, before reflow processes, when the displacement tolerance δ of the chip 120 is far greater than half of the width, W, of the bonding fingers 111, reaching one or more pitches of the bonding fingers 111, i.e., the metal posts 121 are aligned to wrong bonding fingers 111. Then, as shown in FIG. 6B, after reflow processes, the metal posts 121 are soldered to wrong bonding fingers 111 causing wrong signal transmission leading to malfunction of the semiconductor flip-chip assembly.

Therefore, in the conventional MPS-C2 technologies, the displacement tolerance δ of a bumped chip ranges from 0 to half of the width W of the bonding fingers, i.e., 0<δ<½ W. Once the displacement tolerance exceeds the above tolerance ranges, the metal posts can not self-align to the corresponding bonding fingers during reflow processes causing tilting or rotation displacement leading to wrong signal transmission where the flip-chip assembled packages have to be reworked or scrapped which greatly impacts the processing yield and cost. Therefore, the conventional MPS-C2 technologies, flip-chip die bonders with bonding accuracy around ±10 μm are required which can be less than half of the width of the bonding fingers such as <50 μm, about 25 μm. The displacement tolerance δ is controlled under 12.5 μm. Moreover, the alignment accuracy of an existing SMT mounter is around ±50 μm which can not reach the flip-chip assembly requirements of MPS-C2 leading to poor qualities of electrical connections with lower assembly yields.

SUMMARY OF THE INVENTION

The main purpose of the present invention is to provide a semiconductor flip-chip assembly having MPS-C2 structure where the existing SMT mounter with poor alignment accuracy can be implemented for soldering the metal posts to replace the conventional flip-chip die bonder to achieve higher productivity with lower costs in MPS-C2 flip-chip technologies.

The second purpose of the present invention is to provide a semiconductor flip-chip assembly having MPS-C2 structure which can greatly enhance alignment accuracy during soldering of the metal posts in MPS-C2 flip-chip technologies.

According to the present invention, a semiconductor flip-chip assembly having MPS-C2 structure is revealed, primarily comprising a substrate, a chip, a plurality of first soldering materials and a plurality of accessory soldering materials. The substrate has a plurality of first connecting pads and a plurality of accessory pads. The first connecting pads are disposed along a first straight line to have a first pad width and a first pad pitch parallel to the first straight line where the first pad pitch is greater than the first pad width. The chip has a plurality of first metal posts and a plurality of accessory bumps extruded from a same surface of the chip. The first soldering materials solder the first metal posts to the corresponding first connecting pads and the accessory soldering materials solder the accessory bumps to the corresponding accessory pads where the accessory bumps have a plurality of soldered flat tops in dimensions corresponding to the soldered areas of the accessory pads. Moreover, each soldered flat top has a plurality of angular corners and an edge between two adjacent angular corners where the length of the edge is at least twice greater than the one of the first pad pitch.

The semiconductor flip-chip assembly having MPS-C2 structure according to the present invention has the following advantages and functions:

1. Through the specific combination of accessory pads, accessory bumps, and additional solder materials as a technical mean where the dimensions of the soldered flat tops of the accessory bumps are corresponding to the soldered areas of the accessory pads, the soldered flat tops have a plurality of angular corners and an edge between two adjacent angular corners with the length at least twice greater than the one of first pad pitch, the shifting or rotation displacement of metal posts can be obviously self-aligned during reflow processes so that the existing SMT mounter with poor alignment accuracy can be implemented for the flip-chip assembly with soldered metal posts to replace the conventional flip-chip die bonder with high alignment accuracy to increase overall productivity in MPS-C2 technologies.

2. Through the specific combination of accessory pads and soldered flat tops of accessory bumps as a technical mean where the soldered flat tops have a plurality of angular corners covered by the accessory soldering materials, the alignment accuracy of the metal posts can be greatly enhanced during reflow processes in MPS-C2 technologies.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
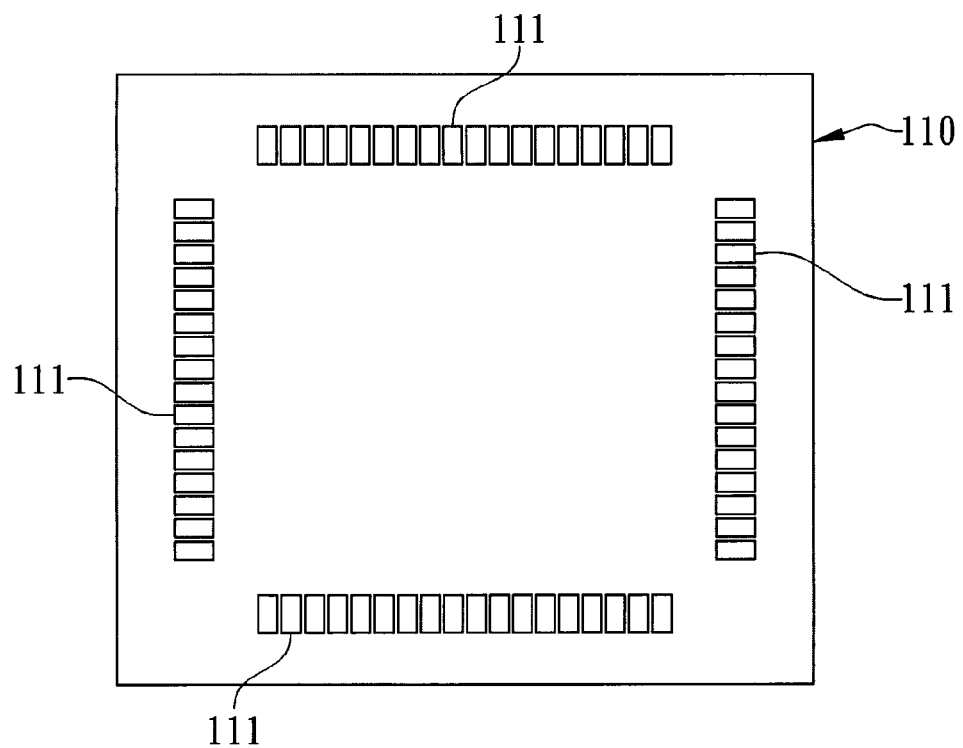
FIG. 1 is a top view of a substrate of a conventional semiconductor flip-chip assembly having MPS-C2 structure.
Figure 2:
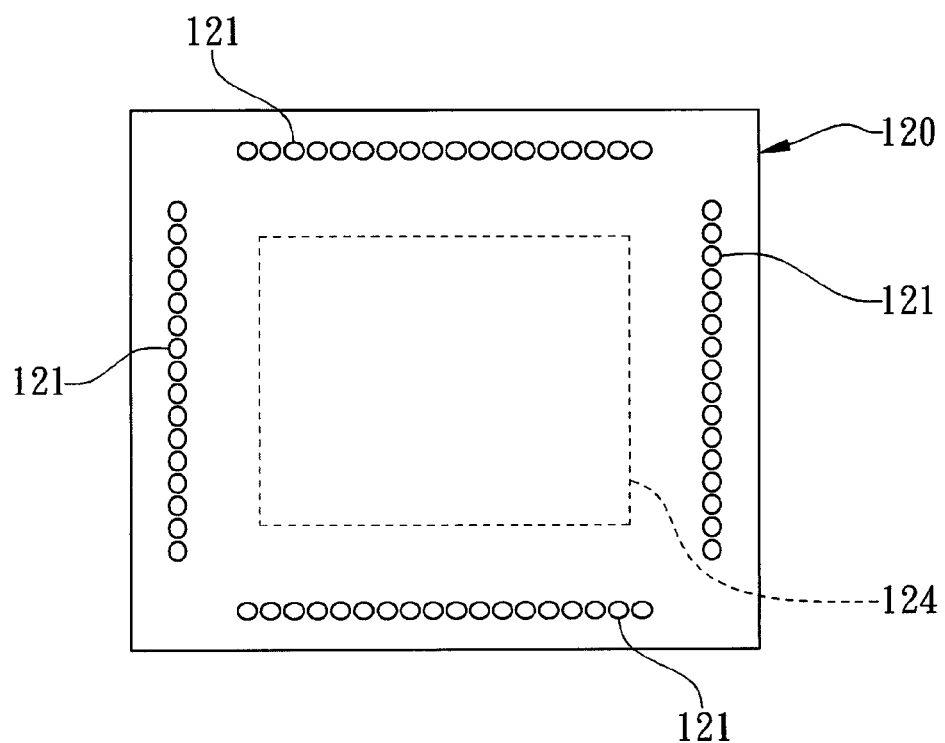
FIG. 2 is a top view of a bumped chip of a conventional semiconductor flip-chip assembly having MPS-C2 structure.
Figure 3:
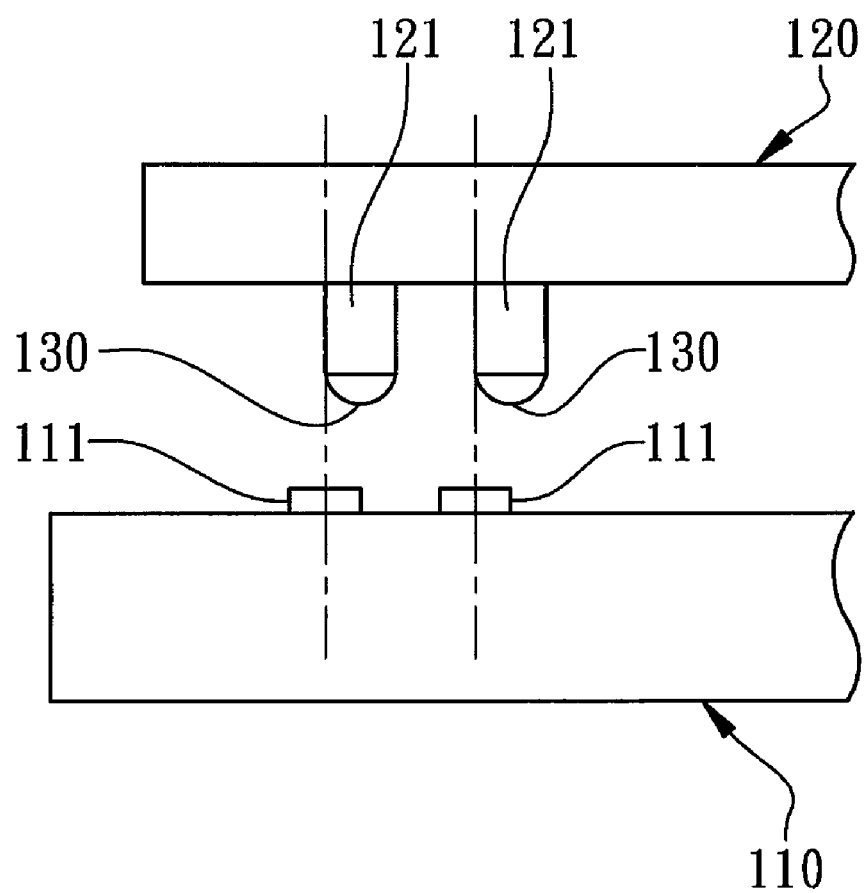
FIG. 3 is a partial cross-sectional view to show the chip mounted to the substrate for fabricating the conventional semiconductor flip-chip assembly.
Figure 4A:
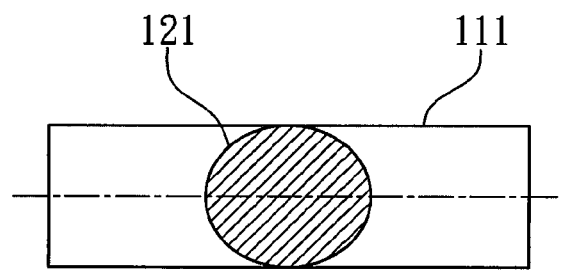
FIGS. 4A to 4C are partial top views and a partial cross-sectional view to show the metal posts jointed to bonding fingers with chip displacement (δ) between 0~½ finger width (W) during fabricating the conventional semiconductor flip-chip assembly.
Figure 4B:
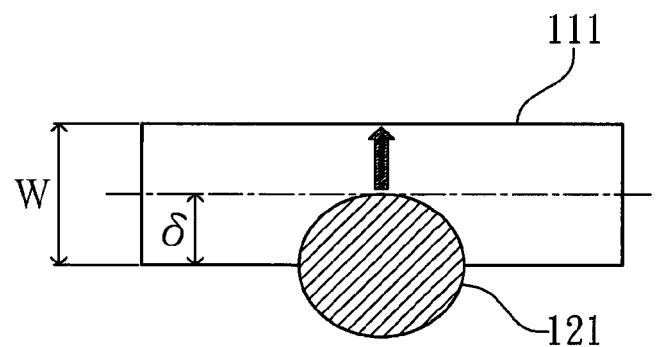
Figure 4C:
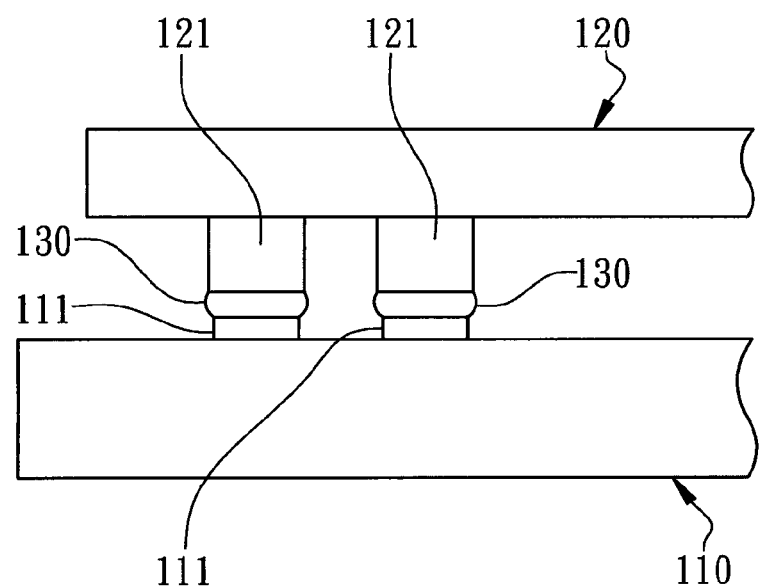
Figure 5A:
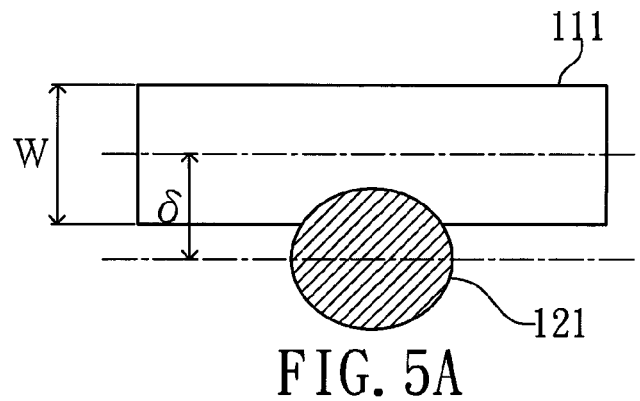
FIGS. 5A to 5C are partial top views and a partial cross-sectional view to show the metal posts jointed to bonding fingers with chip displacement (δ) greater than ½ finger width (W) during fabricating the conventional semiconductor flip-chip assembly.
Figure 5B:
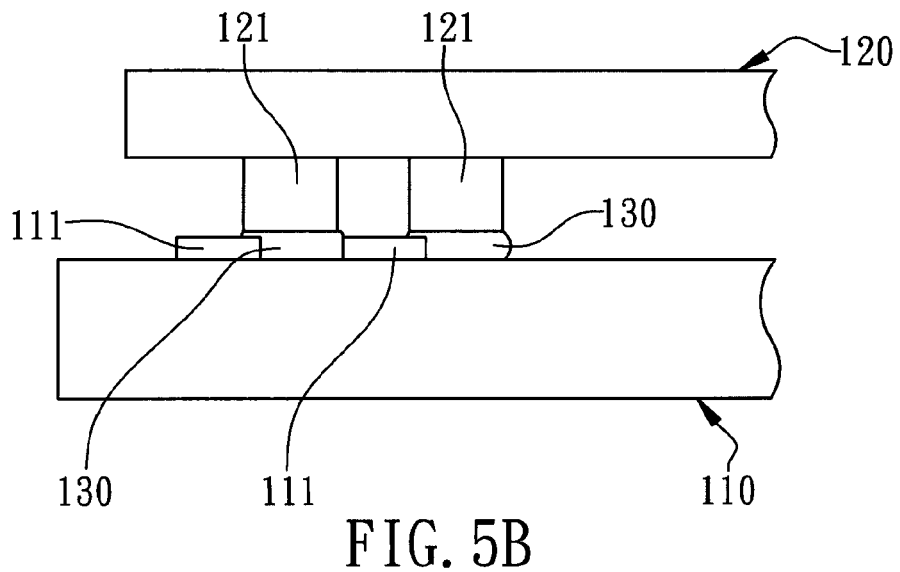
Figure 5C:
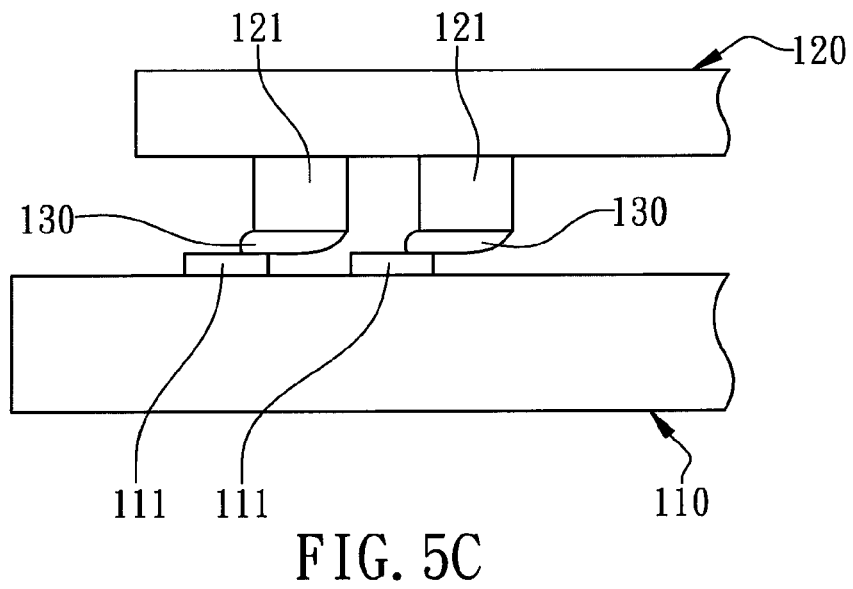
Figure 6A:
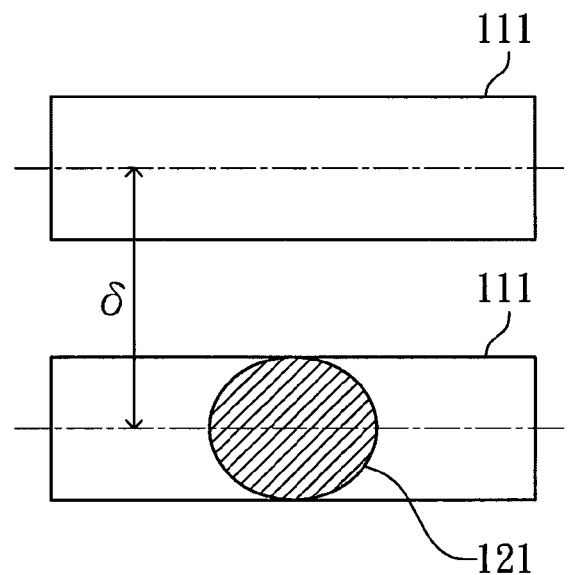
FIGS. 6A and 6B are a partial top view and a partial cross-sectional view to show the metal posts jointed to bonding fingers with chip displacement (δ) equal to the finger pitch during fabricating the conventional semiconductor flip-chip assembly.
Figure 6B:
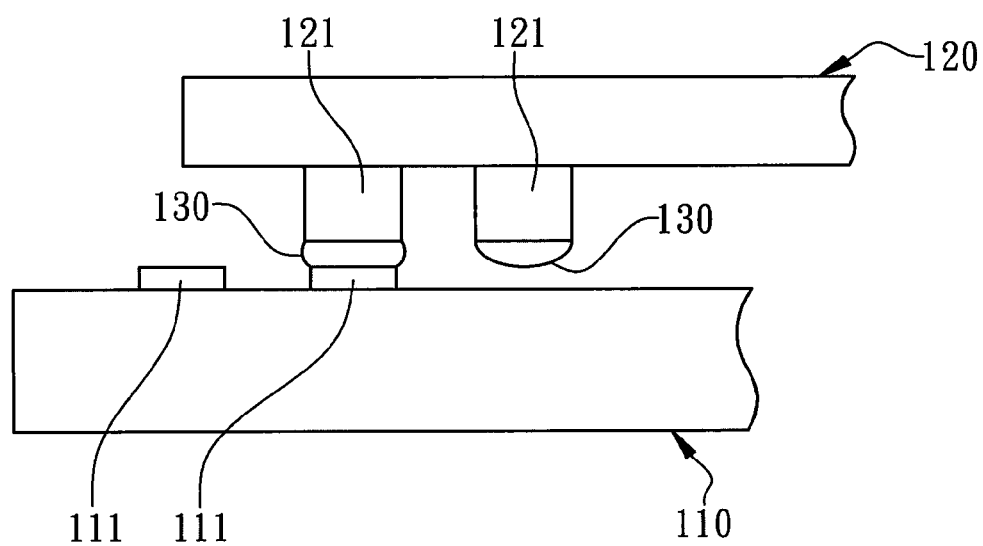
Figure 7:
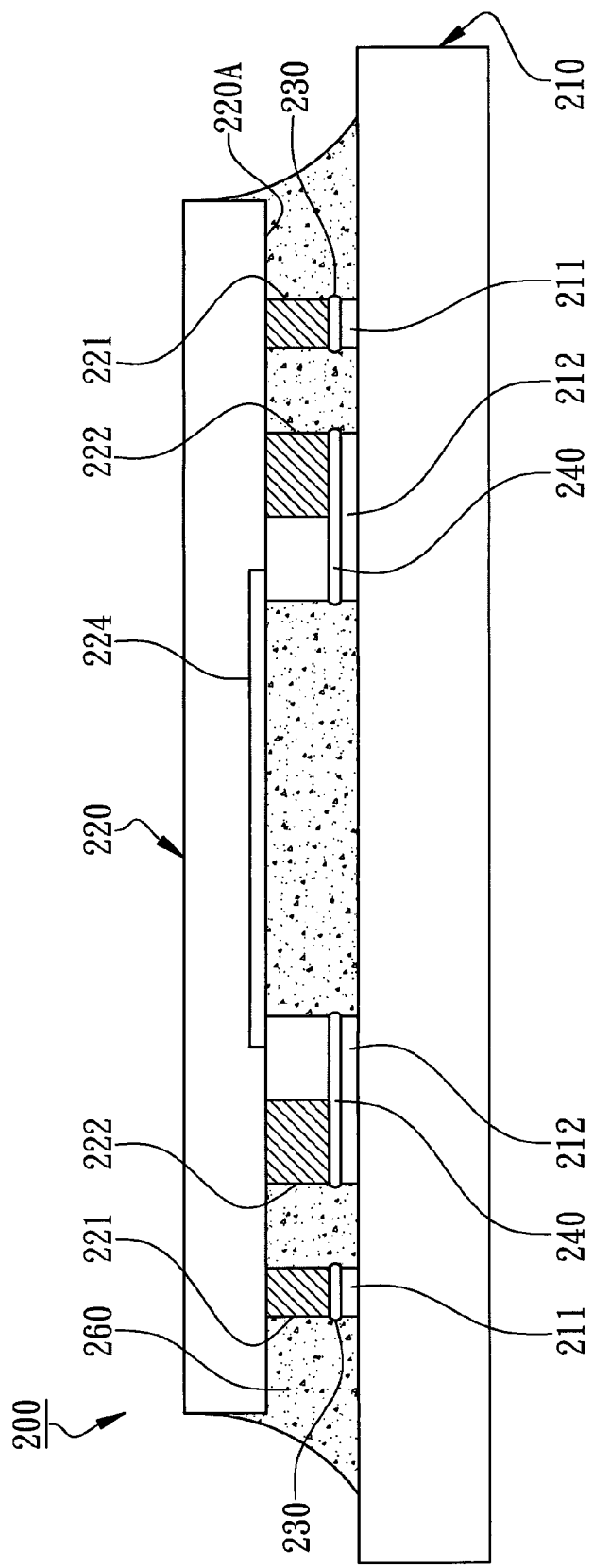
FIG. 7 is a cross-sectional view of a semiconductor flip-chip assembly having MPS-C2 structure according to the first embodiment of the present invention.
Figure 8A:
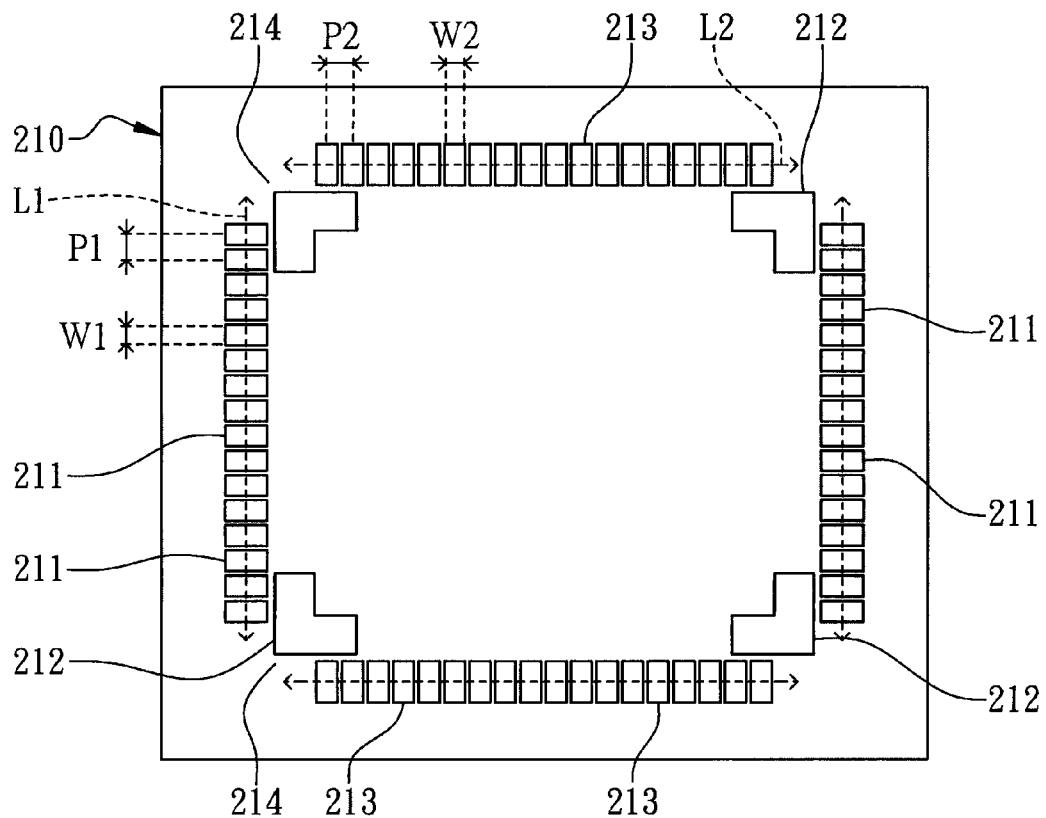
FIGS. 8A and 8B are top and partially enlarged views of a substrate of the flip-chip assembly according to the first embodiment of the present invention.
Figure 8B:
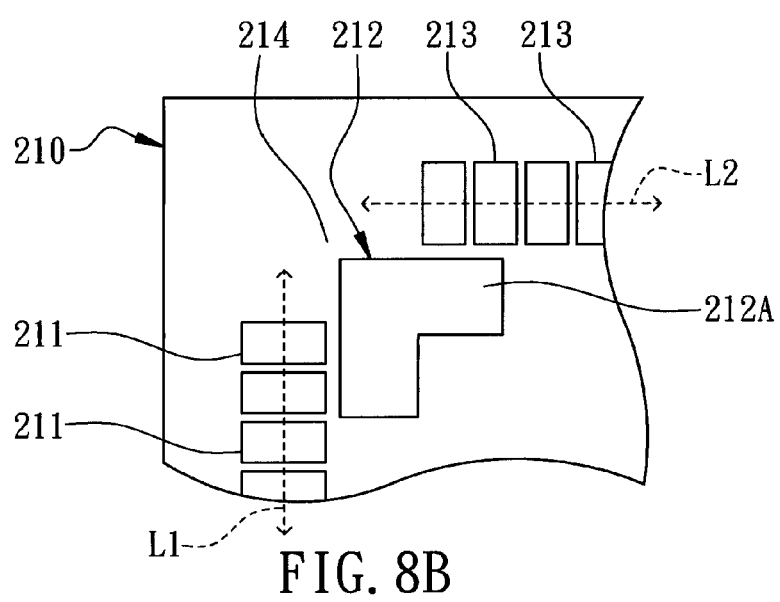
Figure 9A:
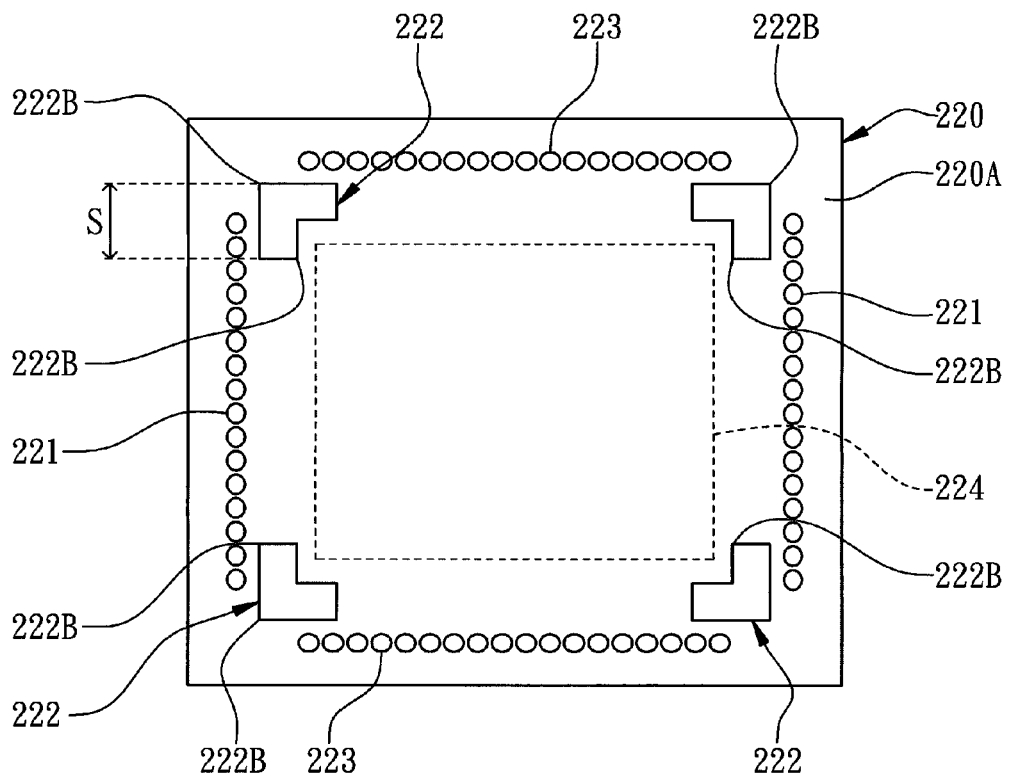
FIGS. 9A and 9B are top and partially enlarged 3D views of a bumped chip of the flip-chip assembly according to the first embodiment of the present invention.
Figure 9B:
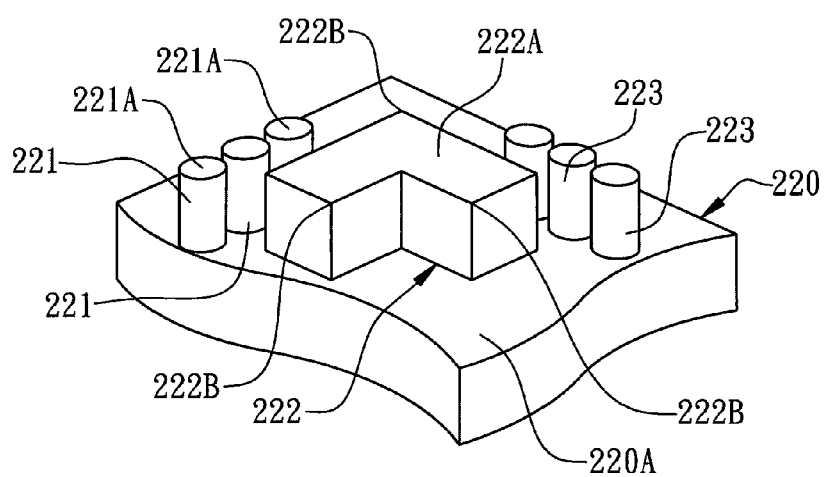

According to the first embodiment of the present invention, a semiconductor device having MPS-C2 structure is illustrated in FIG. 7 for a cross-sectional view. A semiconductor flip-chip assembly 200 primarily comprises a substrate 210, a chip 220, a plurality of first soldering materials 230, and a plurality of accessory soldering materials 240 where the chip 220 is mounted on the substrate 210 by soldered metal posts 221. FIGS. 8A and 8B are top and partial enlarged views of the substrate 210. FIGS. 9A and 9B are top and partially enlarged 3D views of the chip 220.

As shown in FIGS. 8A and 8B, the substrate 210 has a plurality of first connecting pads 211 and a plurality of accessory pads 212. The first connecting pads 211 are disposed along a first straight line L1 to have a first pad width W1 and a first pad pitch P1 defined parallel to the first straight line L1 where the first pad pitch P1 is greater than the first pad width W1. The first pad width is defined as the distance from a side to another side of the first connecting pads 211 on the first straight line L1. The first pad pitch is defined as the distance between the central points of two adjacent first connecting pads 211 on the first straight line L1. Normally, the first pad pitch P1 is twice the first pad width W1 where the first pad pitch is corresponding to the pitch of the bonding pads on the chip 220 which is not greater than 80 μm. In the present embodiment, the first pad pitch P1 is 50 μm. Furthermore, the substrate 210 further has a plurality of second connecting pads 213 disposed along the second straight line L2 to have a second pad width W2 and a second pad pitch P2 defined parallel to the second straight line L2 where the second pad pitch P2 is greater than the second pad width W2 and the second straight line L2 is perpendicular to the first straight line L1. In a preferred embodiment, the second pad pitch P2 is about twice the second pad width W2. The first straight line L1 and the second straight line L2 are fictitious lines defined according to the layout directions of the connecting pads but not solid lines disposed on the substrate 210. Therefore, the layout direction of the first connecting pads 211 is perpendicular to the layout direction of the second connecting pads 213 and all of the connecting pads are disposed in peripheries of the substrate 210. In a preferred embodiment, a corner spacing 214 is formed between the first connecting pads 211 and the second connecting pads 213 to form an incomplete peripheral arrangement, that means no connecting pad is formed at the intersection of the first straight line L1 and the second straight line L2.

As shown in FIGS. 9A and 9B, the chip 220 has a plurality of first metal posts 211 and a plurality of accessory bumps 222 extruded from a same surface 220A where the surface 220A is the active surface of the chip 220. The surface 220A includes a component active area 224 in which IC circuits are formed. In the present embodiment, the first metal posts 221 and the accessory bumps 222 are disposed outside the component active area 224 without affecting the circuit design of the chip 220 and without the deposition of RDL. The first metal posts 221 are configured to electrically connect the chip 220 to the substrate 210. Metal posts have a height more than the thickness of pads with a non-deformable shape to perform stand-off purpose during reflow processes. In the present embodiment, the accessory bumps 222 and the first metal posts 221 are made of the same metal such as copper or gold. The accessory bumps 222 are designed for the purposes of self-alignment and mechanical connections without any electrical functions. In a preferred embodiment, the accessory bumps 222 and the first metal posts 221 are copper metal posts where the first metal posts 221 are cylinders. Furthermore, the chip 220 further has a plurality of second metal posts 223 extruded from the same surface 220A of the chip 220 for soldering to the second connecting pads 213 where the accessory bumps 222 are disposed at the interior angle between the first straight line L1 and the second straight line L2, i.e., the accessory bumps 222 are adjacent to the corner spacing 214 but not on the straight line L1 nor on the straight line L2. Therefore, the first metal posts 221 and the second metal posts 223 can be disposed in a much higher density on the peripheries of the chip 220 without changing the dimension of the chip 220. To be more specific, the first metal posts 221 and the second metal posts 223 are not located at the corners of the chip 220 due to the incomplete peripheral arrangement. In the present embodiment, as shown in FIG. 9B, each accessory bump 222 has a soldered flat top 222A with a dimension completely corresponding to the soldered area 212A of the corresponding accessory pad 212, referred to FIGS. 8B and 9B. Accordingly, the soldered flat top 222A and the soldered area 212A are the same in shape and in area. More specific, the soldered flat top 222A has a plurality of angular corners 222B and an edge between two adjacent angular corners 222B as shown in FIG. 9A where the length S of the edge is more than twice greater than the first pad pitch P1. To be more specific, the length S of the edge can be greater than 100 μm while the first pad width W1 ranges from 20 μm to 50 μm, i.e., the length S can be around two to four times greater than the first pad width W1 or more. In the present embodiment, the soldered flat top 222A is in L-shape to have five angular corners 222B. By using the specific shapes of the soldered flat tops 222A of the accessory bumps 222, the number of the angular corners 222B in one soldered flat top can be increased more than four to further enhance the alignment accuracy of metal posts during reflow processes. In a preferred embodiment, each angular corner 222B is 90 degrees or less than 90 degrees to make the angular corners 222b become right angles or acute angles to improve self-alignment function. Furthermore, each first metal post 221 has a flat top surface 221A with a dimension smaller than the one of the soldered flat top 222A and with a shape not corresponding to the one of the first connecting pads 211. In the present embodiment, the flat top surfaces 221A and the soldered flat tops 222A can be located in the same horizontal plane so that the heights of the first metal posts 221 and the accessory bumps 222 are the same. Moreover, in the present embodiment, the flat top surfaces 221A can be circular and the first connecting pads 221 are finger-like where the dimension of the first connecting pads 211 is not less than the dimension of the flat top surfaces 221A. As shown in FIGS. 8A and 8B, each accessory pad 212 has a side corresponding to the edge of the soldered flat top 222A parallel to the first straight line L1.

Figure 10A:
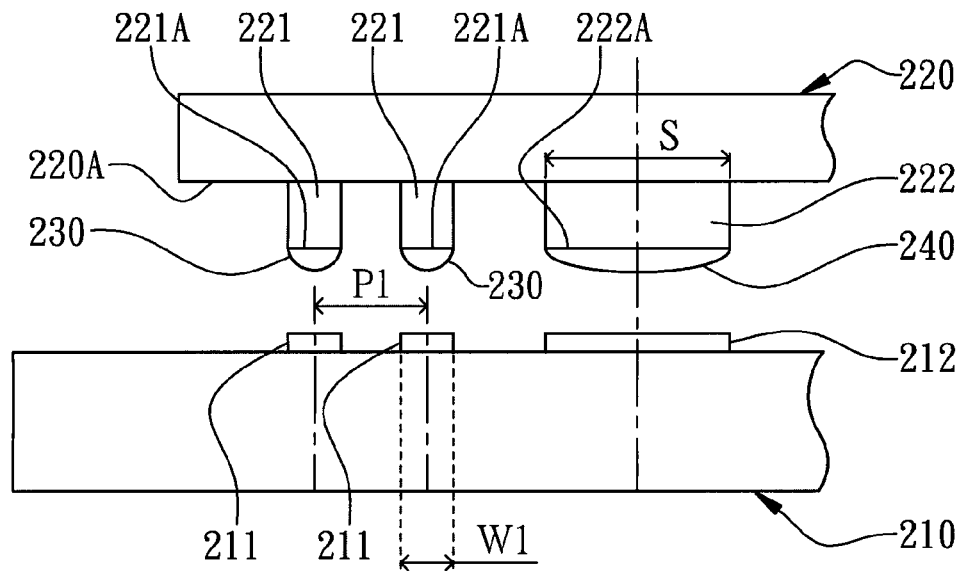
FIGS. 10A to 10C are partial cross-sectional views to show the bumped chip mounted to the substrate with planar self-alignment during fabricating the flip-chip assembly according to the first embodiment of the present invention.
Figure 10B:
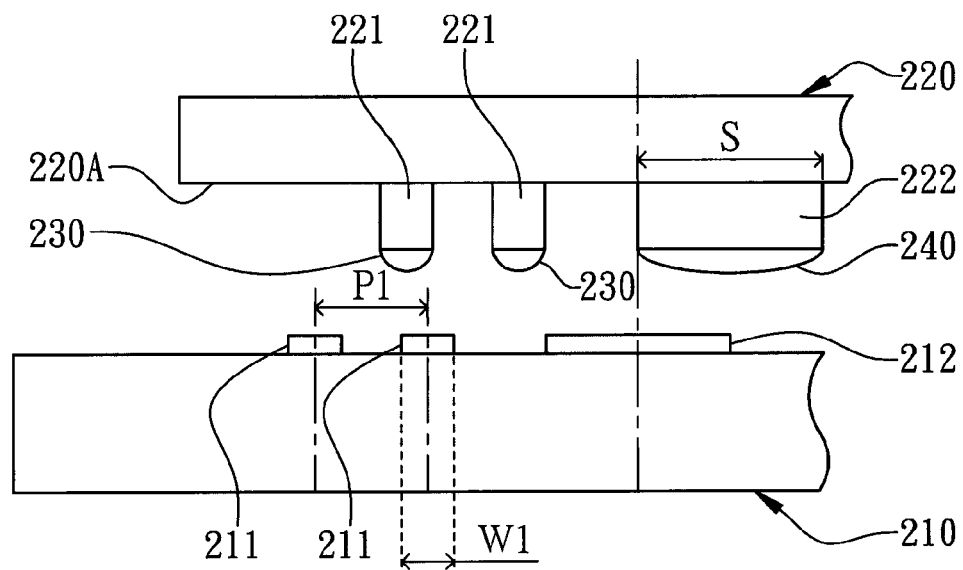
Figure 10C:
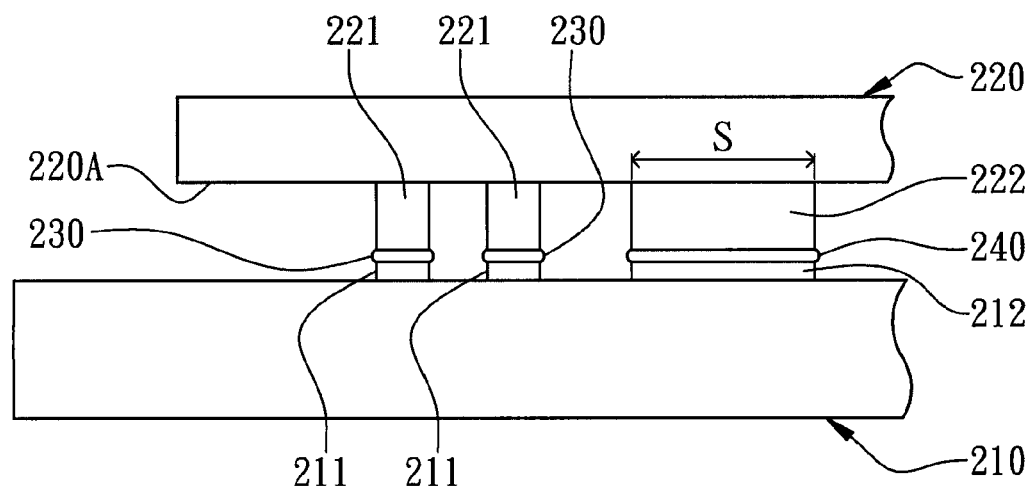

As shown in FIGS. 7 and 10C, the first soldering materials 230 solder the first metal posts 221 to the first connecting pads 211. In one embodiment, as shown in FIG. 10A, the first soldering materials 230 can be preformed on the flat top surfaces 221A of the first metal posts 221. The material of the first soldering materials 230 is Sn—Ag. Since the first soldering materials 230 only cover the flat top surfaces 221A without covering the sidewalls of the first metal posts 221, therefore, the thickness of the first soldering materials 230 is less than the height of the first metal posts 221 so that the first soldering materials 230 don't have apparent circular surface expansion during soldering the first metal posts 221 to the first connecting pads 211. Thus, the first metal posts 221 can be disposed in a much higher density on the surface 220A of the chip 220. As shown in FIGS. 7 and 10C again, the accessory soldering materials 240 solder the accessory bumps 222 to the accessory pads 212 where the accessory soldering materials 240 can fully cover the angular corners 222B without fully covering the accessory bumps 222 and the thickness of the second soldering materials 240 is smaller than the heights of the accessory bumps 222 so that the accessory soldering materials 240 are effectively able to self-align even when the chip displacement is greater than half of the pad width, for example, the thickness of the accessory soldering materials 240 is about two-third of the height of the accessory bumps 222. The first soldering materials 230 and the accessory soldering materials 240 can be respectively disposed on the first metal posts 221 and on the accessory bumps 222 by printing, plating, dipping or transferring in advance. Furthermore, a plurality of second soldering materials, not shown in the figure, are further included to solder the second metal posts 223 to the second connecting pads 213 where the accessory soldering materials 240, the first soldering materials 230, and the second soldering materials can be the same or different materials. When the same material is implemented, the misalignment issue where the chip displacement is greater than half of the pad width but less than the pad pitch can be resolved. In a preferable embodiment, the reflow temperature of the accessory soldering materials 240 can be lower than the reflow temperature of the first soldering materials 230 to overcome the misalignment issue when the chip displacement is greater than the pad pitch but smaller than half of the width of the accessory pads 212. During reflow processes, the accessory soldering materials 240 begin to melt to become liquid when temperature ramps up so that self-alignment becomes effective due to surface tension where the melted accessory soldering materials 240 drive the centers of the soldered flat top 222A of the accessory bumps 222 toward the centers of the accessory pads 212 to make the chip 220 accurately align to the substrate 210. Then, as the temperature continues to rise, the first soldering materials 230 begin to melt to achieve soldering of metal posts 221 to complete electrical connections, as shown in FIG. 7 and FIG. 10C.

As shown in FIG. 10A, when implementing an SMT mounter to flip-chip assemble the chip 220 to the substrate 210 according to the present invention, the accessory bumps 222 and the first metal posts 221 of the chip 220 are individually aligned to the accessory pads 212 and the first connecting pads 211 of the substrate 210. Since an SMT mounter has the capability of batch-type mass production with poor alignment accuracy leading to misalignment of the chip 220 and the substrate 210, as shown in FIG. 10B, the displacement tolerance of the chip 220 is far exceeded the conventional self-alignment tolerance of flip chip assembly where the displacement δ of the first metal posts 221 is greater than half of the first pad width W1, i.e. δ>½ W1, or even worse, the displacement δ is almost the same as the first pad pitch P1 when serious misalignment encountered. However, the displacement of the accessory bumps 221 is still smaller than half of the width S of the accessory pads 212 which is still within the self-alignment tolerance, i.e., δ<½ S. Therefore, during reflow processes, the accessory soldering materials 240 melt to become liquid, through the surface tensions of the melting accessory soldering materials 240 exerted on the accessory bumps 222 and the accessory pads 212, the accessory bumps 222 are pulled back and aligned to the accessory pads 212 and simultaneously the first metal posts 221 are also pulled back and aligned to the corresponding first connecting pads 211. As shown in FIG. 10C, the chip 220 is connected to the substrate 210 after reflow processes so that the first metal posts 221 are accurately soldered to the corresponding first connecting pads 211 to achieve electrical and mechanical connections.

In the present invention, as shown in FIGS. 8B and 9B, through specific combinations of the dimensions of the soldered flat tops 222A of the accessory bumps 222 corresponding to the soldered areas 212A of the accessory pads 212 where the soldered flat tops 222A have the length S of the edge between the angular corners 222B twice greater than the first pad pitch P1, an SMT mounter with poor alignment accuracy can replace the more advanced and more expensive flip-chip die bonder for fabricating the flip chip assembly with MPS-C2 structure to further enhance the advantages of an SMT mounter to increase overall productivity. In one of the embodiment to achieve the above mentioned advantages, the semiconductor flip-chip assembly 200 during reflow processes, the accessory soldering materials 240 melt firstly to have enough surface tension to achieve self-alignment of the accessory bumps 222 to the accessory pads 212, meanwhile, the misaligned first metal posts 221 are also automatically pulled back to align to the corresponding first connecting pads 211 of the substrate 210. Therefore, the existing SMT mounter with poor alignment accuracy can be fully implemented to achieve higher productivity and higher yields with good alignment accuracy through the soldered accessory bumps 222 to replace the conventional expensive flip-chip die bonder. The productivity comparison between the conventional flip-chip die bonder for MPS-C2 and an SMT mounter according to the present invention is shown in the following table.

| Items | Productivity | Alignment accuracy |
| --- | --- | --- |
| Conventional | UPH ~ 1000 | Flip chip die bonder (±10 μm) |
| Present invention | UPH > 10,000 | SMT mounter (±50 μm) |

Figure 11A:
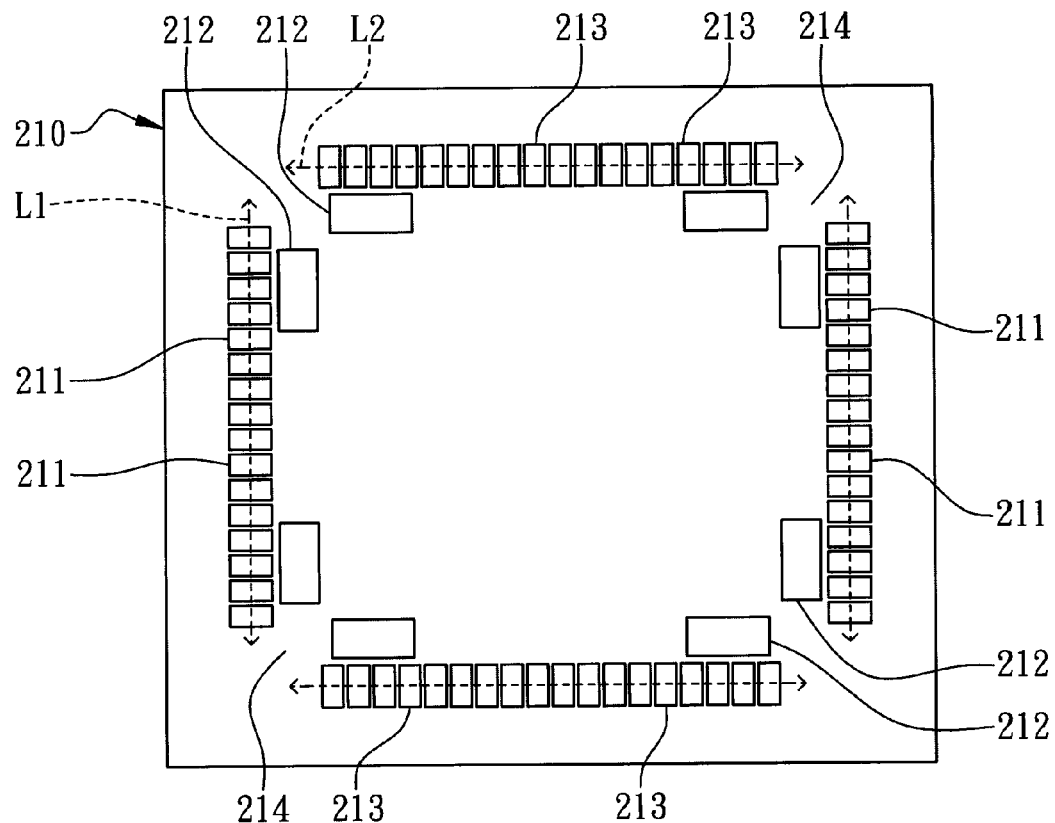
FIGS. 11A and 11B are top and partially enlarged views of a substrate of another flip-chip assembly according to the second embodiment of the present invention.
Figure 11B:
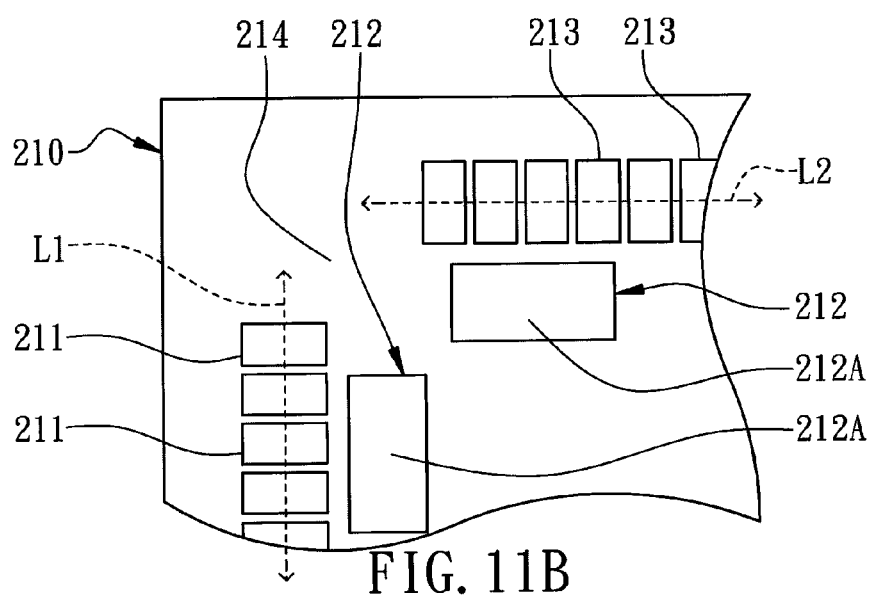
Figure 12A:
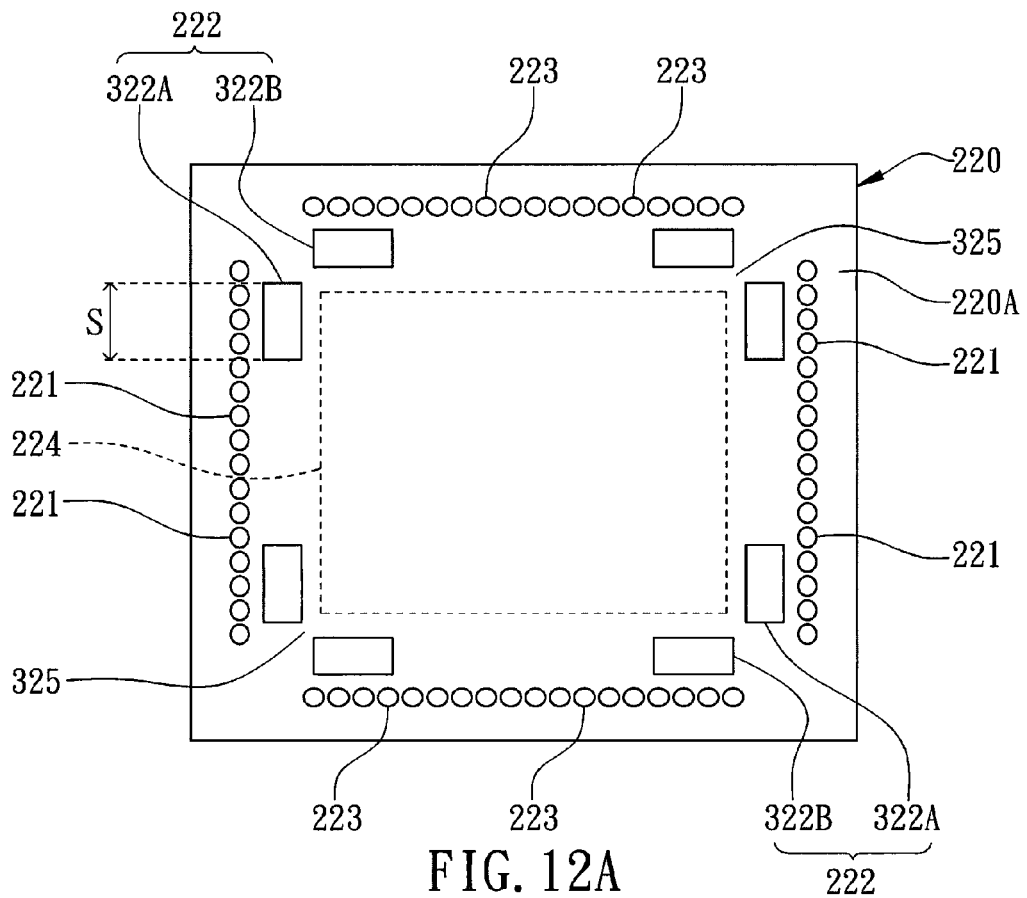
FIGS. 12A and 12B are top and partially enlarged 3D views of a bumped chip of another flip-chip assembly according to the second embodiment of the present invention.
Figure 12B:
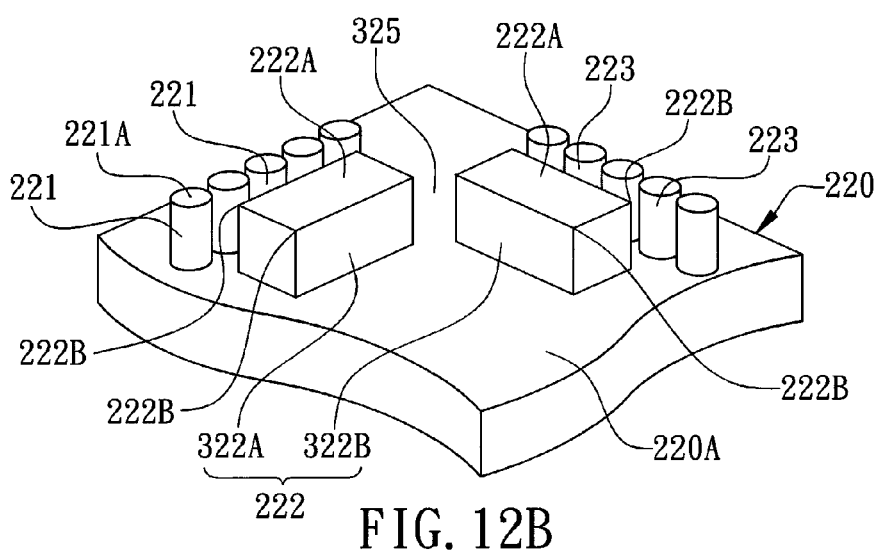

According to the second embodiment of the present invention, another semiconductor flip-chip assembly having MPS-C2 structure primarily comprises a substrate 210 as shown in FIG. 11A and FIG. 11B and a chip 220 as shown in FIG. 12A and FIG. 12B, further comprising a plurality of first soldering materials 230 and a plurality of accessory soldering materials 240 where the major components and described numbers are the same as the first embodiment which will not be explained again.

As shown in FIG. 12A and FIG. 12B, in the present embodiment, each accessory bump 222 is composed by two individual sub-bumps, a first sub-bump 322A and a second sub-bump 322B. A filling gap 325 is formed between the first sub-bump 322A and the second sub-bump 322B where the filling gap 325 is aligned to the corner spacing 214 to enhance underfilling of the joint height through the filling gap 325. To be more specific, the soldered flat tops 222A of the first sub-bumps 322A and the second sub-bumps 322B are long rectangles where the disposition direction of the first sub-bumps 322A is perpendicular to the disposition direction of the second sub-bumps 322B to avoid overlapping the component active area 224 (as shown in FIG. 12A). The so-called "long rectangles" means that the length of the longer side is equal to or more than twice the length of the shorter side and each soldered flat top 222A has four angular corners 222B.

As shown in FIGS. 11A and 11B, the dimensions of the accessory pads 212 are corresponding to the soldered flat tops 222A to have same shape and area. Each accessory pad 212 has a side corresponding to the edge S parallel to the first straight line L1. Therefore, after mounting the chip 220 to the substrate 210, an underfill material 260 can be easily formed in the central gap between the chip 220 and the substrate 210 through the filling gap 325 and encapsulate the metal posts 221 and accessory bumps 222 (as shown in FIG. 7) so that the semiconductor flip-chip assembly is completely sealed and the impact of stresses or forces induced by CTE mismatching between the chip 220 and the substrate 210 can be effectively reduced through the underfill materials to enhance the lifetime of the chip.

Figure 13A:
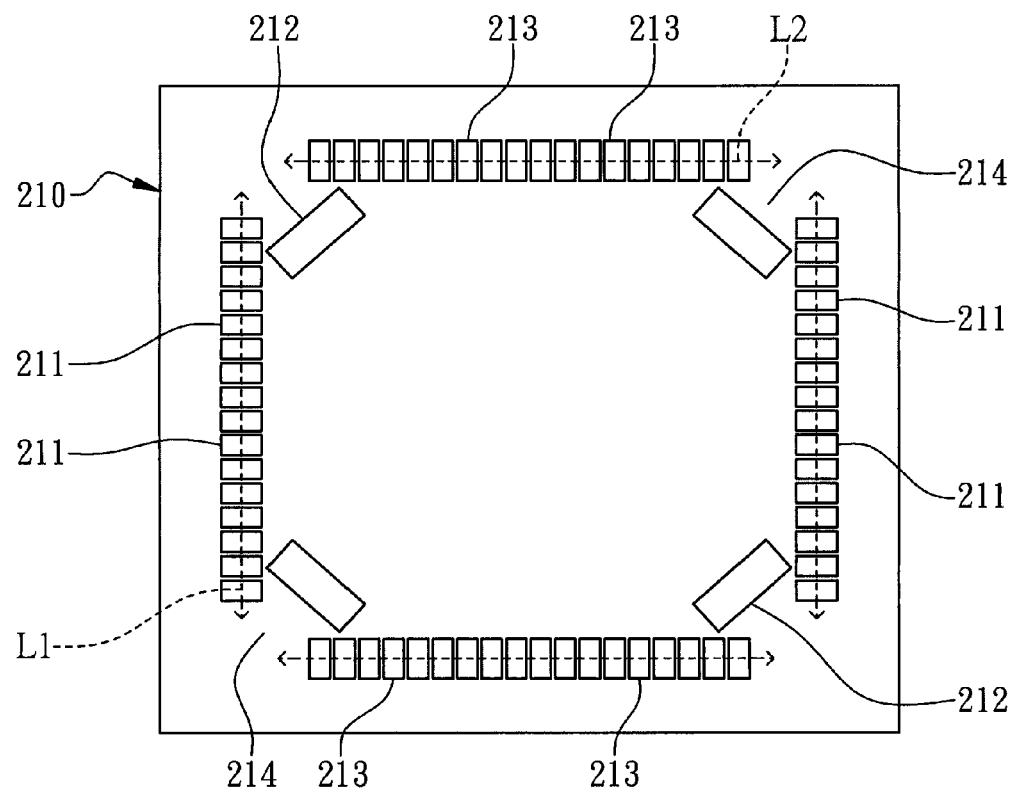
FIGS. 13A and 13B are top and partially enlarged views of a substrate of another flip-chip assembly according to the third embodiment of the present invention.
Figure 13B:
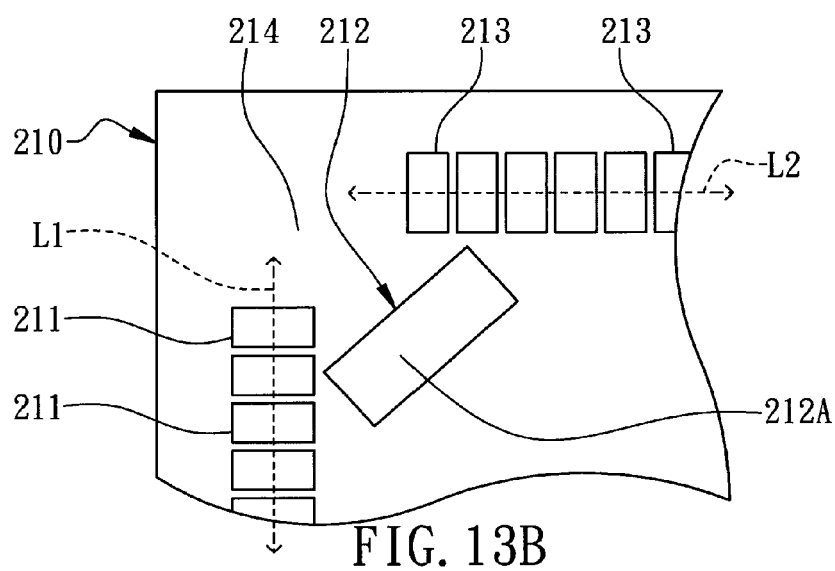
Figure 14A:
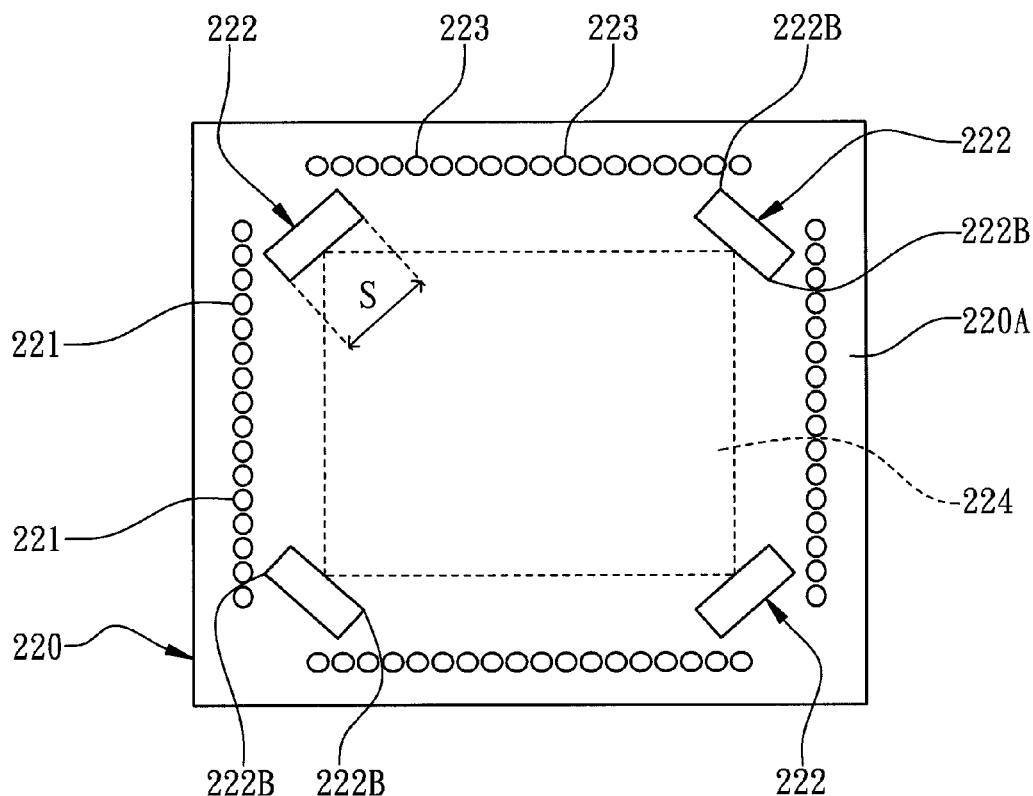
FIGS. 14A and 14B are top and partially enlarged 3D views of a bumped chip of another flip-chip assembly according to the third embodiment of the present invention.
Figure 14B:
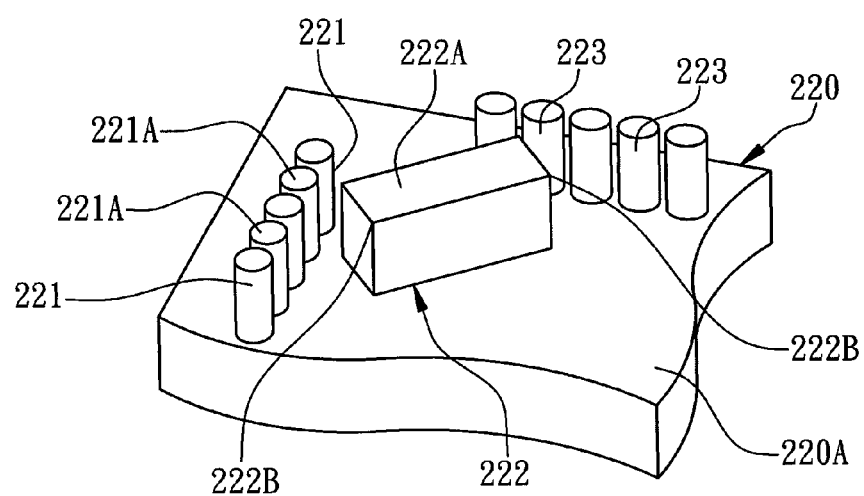

According to the third embodiment of the present invention, another semiconductor flip-chip assembly having MPS-C2 structure primarily comprises the substrate 210 as shown in FIG. 13A and FIG. 13B and the chip 220 as shown in FIGS. 14A and 14B, further comprising a plurality of first soldering materials 230 and a plurality of accessory soldering materials 240 where the major components and described numbers are the same as the first embodiment which will not be explained again.

As shown in FIG. 13A and FIG. 14A, the accessory pad 212 has a side corresponding to the edge S of the solder flat top 222A of the accessory bumps 222 where the side is tilt and not parallel to the first straight line L1. An angle formed between the tilt side and the first straight line L1 is greater than 0 degree and smaller than 90 degrees. In one of the embodiment, as shown in FIG. 13B, the angle between the side and the first straight line L1 is about 45 degrees so that the side is facing to the corner spacing 214. To be more specific, the dimensions of the soldered flat tops 222A of the accessory bumps 222 are corresponding to the soldered areas 212A of the accessory pads 212.

Figure 15A:
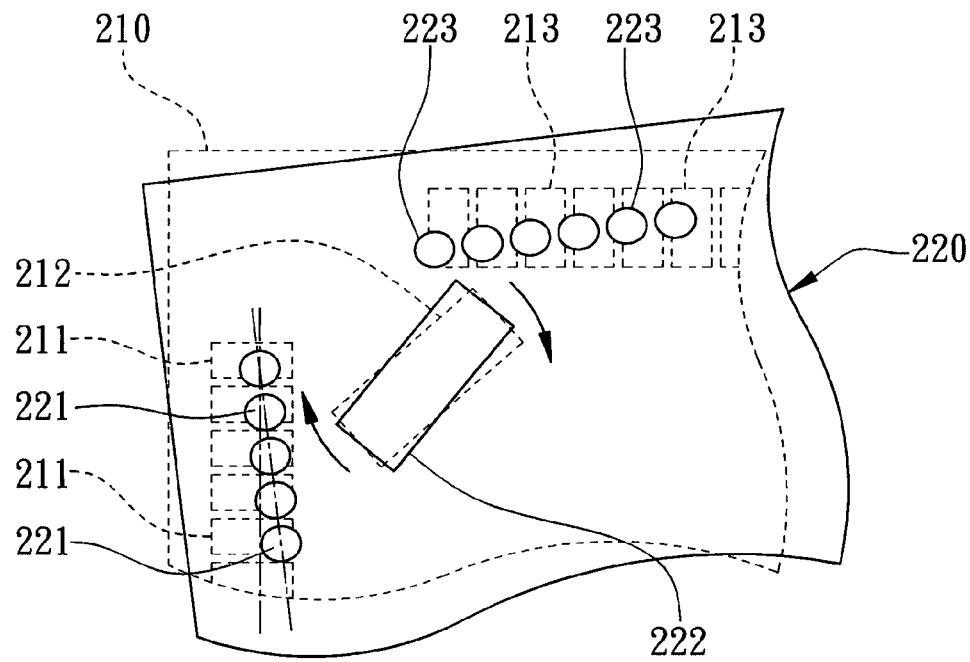
FIGS. 15A and 15B are top views to show the bumped chip mounted to the substrate with rotation self-alignment during fabricating the flip-chip assembly according to the third embodiment of the present invention.
Figure 15B:
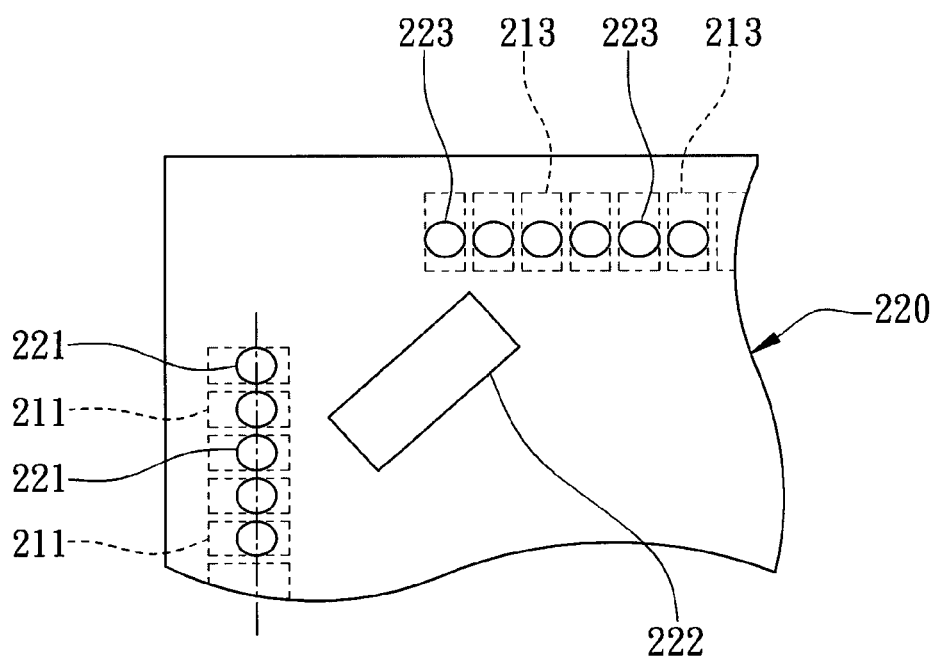

As shown in FIG. 15A, when the chip 220 is mounted to the substrate 210 through a reflow processes, the electrical connections between the chip 220 and the substrate 210 is completed by the soldered metal posts 223. Once the chip 220 has rotation displacement and can not be accurately aligned to the substrate 210, a rotation angle is formed between the chip 220 and the substrate 210. Through the soldering relationship between the accessory bumps 222 and the accessory pads 212 to generate the self-alignment ability due to the surface tension induced by the melting of the accessory soldering materials during the reflow processes, the accessory bumps 222 will rotate to achieve self-alignment, as shown by the rotation arrow in FIG. 15A, so that the accessory bumps 222 are accurately aligned to the accessory pads 212. As shown in FIG. 15B, when the accessory bumps 222 are self-aligned to the accessory pads 212, the chip 220 can be accurately aligned and connected to the substrate 210 to achieve and assure excellent quality of electrical connections between the chip 220 and the substrate 210.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A semiconductor device having MPS-C2 (Metal Post Solder-Chip Connection) structure, comprising:
a substrate having a plurality of first connecting pads and a plurality of accessory pads, wherein the first connecting pads are disposed along a first straight line to have a first pad width and a first pad pitch parallel to the first straight line, wherein the first pad pitch is greater than the first pad width;
a chip having a plurality of first metal posts and a plurality of accessory bumps both extruded from a same surface of the chip;
a plurality of first soldering materials soldering the first metal posts to the first connecting pads; and
a plurality of accessory soldering materials soldering the accessory bumps to the accessory pads;
wherein the accessory bumps have a plurality of soldered flat tops in dimensions corresponding to the soldered areas of the accessory pads, wherein each soldered flat top has a plurality of angular corners and an edge between two adjacent angular corners where the length of the edge is twice greater than the first pad pitch.

2. The semiconductor device as claimed in claim 1, wherein the reflow temperature of the accessory soldering materials is lower than the reflow temperature of the first soldering materials.

3. The semiconductor device as claimed in claim 1, wherein the length of the edge is greater than 100 μm and the first pad width ranges from 20 μm to 50 μm.

4. The semiconductor device as claimed in claim 1, wherein the angular corners are equal to or less than 90 degrees.

5. The semiconductor device as claimed in claim 1, wherein each first metal post has a flat top surface which is smaller than the area of the soldered flat top with a shape not corresponding to the shape of the first connecting pads.

6. The semiconductor device as claimed in claim 5, wherein the flat top surfaces are circular and the first connecting pads are finger-like.

7. The semiconductor device as claimed in claim 1, wherein the soldered flat tops are in L-shape each having five angular corners.

8. The semiconductor device as claimed in claim 1, wherein the substrate further have a plurality of second connecting pads disposed along a second straight line to have a second pad width and a second pad pitch parallel to the second straight line, wherein the second pad pitch is greater than the second pad width and the second straight line is perpendicular to the first straight line, wherein the chip further has a plurality of second metal posts extruded from the same surface of the chip to solder to the second connecting pads, wherein the accessory bumps are located at an interior corner between the first straight line and the second straight line.

9. The semiconductor device as claimed in claim 8, wherein a corner spacing is formed between the first connecting pads and the second connecting pads to form an incomplete peripheral arrangement, wherein the accessory bumps are adjacent to the corner spacing.

10. The semiconductor device as claimed in claim 8, further comprising a plurality of second soldering materials soldering the second metal posts to the corresponding second connecting pads.

11. The semiconductor device as claimed in claim 9, wherein each accessory bump is composed by a first sub-bump and a second sub-bump which are independent and adjacent to each other, wherein a filling gap is formed between the first sub-bump and the second sub-bump and is aligned to the corner spacing.

12. The semiconductor device as claimed in claim 11, wherein the disposition direction of the first sub-bump is perpendicular to the disposition direction of the second sub-bump without overlapping a component active area of the chip.

13. The semiconductor device as claimed in claim 11, wherein the soldered flat tops of the first sub-bump and the second sub-bump are long rectangles.

14. The semiconductor device as claimed in claim 1, wherein the accessory pad has a side corresponding to the edge where the side is tilt and not parallel to the first straight line, wherein the angle formed between the first straight line and the side is greater than 0 degree and less than 90 degrees.

15. The semiconductor device as claimed in claim 1, wherein the accessory pad has a side corresponding to the edge parallel to the first straight line.

16. The semiconductor device as claimed in claim 1, wherein the accessory soldering materials further cover the angular corners without completely covering the accessory bumps, wherein the thickness of the accessory soldering materials is less than the height of the accessory bumps.

17. The semiconductor device as claimed in claim 1, wherein the chip further has a component active area in the surface where the first metal posts and the accessory bumps are disposed outside the component active area.

18. The semiconductor device as claimed in claim 1, wherein the accessory bumps and the first metal posts are made of the same metal.

19. The semiconductor device as claimed in claim 18, wherein the metal of the accessory bumps and the first metal posts is copper, wherein the first metal posts are cylinders.

20. The semiconductor device as claimed in claim 1, wherein the accessory bumps have no electrical function.

* * * * *